(12) United States Patent
Lin et al.

(10) Patent No.: US 11,456,380 B2
(45) Date of Patent: Sep. 27, 2022

(54) TRANSISTOR STRUCTURE AND MANUFACTURING METHOD OF THE SAME

(71) Applicant: TAIWAN SEMICONDUCTOR MANUFACTURING COMPANY LTD., Hsinchu (TW)

(72) Inventors: Tung-Yang Lin, New Taipei (TW); Hsueh-Liang Chou, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/464,737

(22) Filed: Mar. 21, 2017

(65) Prior Publication Data

US 2018/0277677 A1  Sep. 27, 2018

(51) Int. Cl.
| | |
|---|---|
| *H01L 29/78* | (2006.01) |
| *H01L 29/66* | (2006.01) |
| *H01L 29/40* | (2006.01) |

(52) U.S. Cl.
CPC ........ *H01L 29/7831* (2013.01); *H01L 29/401* (2013.01); *H01L 29/6656* (2013.01); *H01L 29/66484* (2013.01); *H01L 29/66492* (2013.01); *H01L 29/7835* (2013.01)

(58) Field of Classification Search
CPC ......... H01L 29/7831; H01L 21/823468; H01L 29/66484; H01L 29/6656; H01L 29/401; H01L 29/7835; H01L 29/66492
See application file for complete search history.

(56) References Cited

U.S. PATENT DOCUMENTS

| | | | | |
|---|---|---|---|---|
| 7,408,230 | B2 * | 8/2008 | Park | H01L 27/115 257/314 |
| 8,803,234 | B1 * | 8/2014 | Liao | H01L 29/402 257/335 |
| 9,391,196 | B1 * | 7/2016 | Chang | H01L 29/402 |
| 2003/0038298 | A1 * | 2/2003 | Cheng | H01L 27/0262 257/107 |
| 2005/0003614 | A1 * | 1/2005 | Min | H01L 27/105 438/257 |
| 2006/0091503 | A1 * | 5/2006 | Wu | H01L 29/7835 257/640 |
| 2007/0045675 | A1 * | 3/2007 | Chen | H01L 29/66568 257/288 |
| 2011/0193161 | A1 * | 8/2011 | Zhu | H01L 29/402 257/343 |
| 2012/0168869 | A1 * | 7/2012 | Hikida | H01L 29/4238 257/365 |
| 2018/0012970 | A1 * | 1/2018 | Kim | H01L 29/4983 |

* cited by examiner

*Primary Examiner* — Monica D Harrison
*Assistant Examiner* — John Lin
(74) *Attorney, Agent, or Firm* — WPAT, P.C., Intellectual Property Attorneys; Anthony King

(57) ABSTRACT

Present disclosure provides a transistor structure, including a substrate, a first gate over the substrate, a second gate over the substrate and laterally in contact with the first gate, a first conductive region of a first conductivity type in the substrate, self-aligning to a side of the first gate, and a second conductive region of the first conductivity type in the substrate, self-aligning to a side of the second gate. A method for manufacturing the transistor structure is also disclosed.

20 Claims, 14 Drawing Sheets

TRANSISTOR STRUCTURE AND MANUFACTURING METHOD OF THE SAME

BACKGROUND

Power semiconductor devices, such as high-power bipolar junction transistors ("HPBT"), power metal oxide semiconductor field effect transistors ("MOSFET"), or gate turn-off thyristors ("GTO"), are semiconductor devices that are capable of controlling or passing large amounts of current and blocking high voltages. Power MOSFETS are generally known and one of the most critical parameters for a power MOSFET is the specific on-resistance (i.e., the resistance of the device in the linear region when the device is turned on). The specific on-resistance for a power MOSFET preferably should be as small as possible so as to maximize the source to drain current per unit area for a given source to drain voltage applied to the MOSFET. The lower the specific on-resistance, the lower the voltage drop is for a given current rating.

Conventional power MOSFETs are manufactured in silicon (Si). MOSFETs formed in Si, however, have certain performance limitations inherent in the Si material itself, such as the thickness of the drain-drift region. The largest contributory factor to specific on-resistance is the resistance of the drain-drift region of the MOSFET. The thickness and doping of the drain-drift region limit the on-resistance. As the rated voltage of a MOSFET is increased, typically the drain-drift region thickness is increased and the drain-drift region doping is decreased. Therefore, the resistance of the drain-drift region increases dramatically. Hence, the thickness of the drain-drift region should be minimized for any given rated voltage so as to minimize the specific on-resistance for the device Power MOSFETs include drift regions, which are lightly doped with a p-type or an n-type impurity. The concentrations of the drift regions are low, so that the breakdown voltages of the power MOSFETs are increased. A conventional MOSFET has a Shallow Trench Isolation (STI) region extending below the respective gate electrode. A drain-side drift region extends underlying the gate electrode, and adjoins a channel region that has an opposite conductivity type than the drain-side drift region. The channel region also extends underlying the gate electrode.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

Like reference symbols in the various drawings indicate like elements.

DETAILED DESCRIPTION OF THE DISCLOSURE

Figure 1:
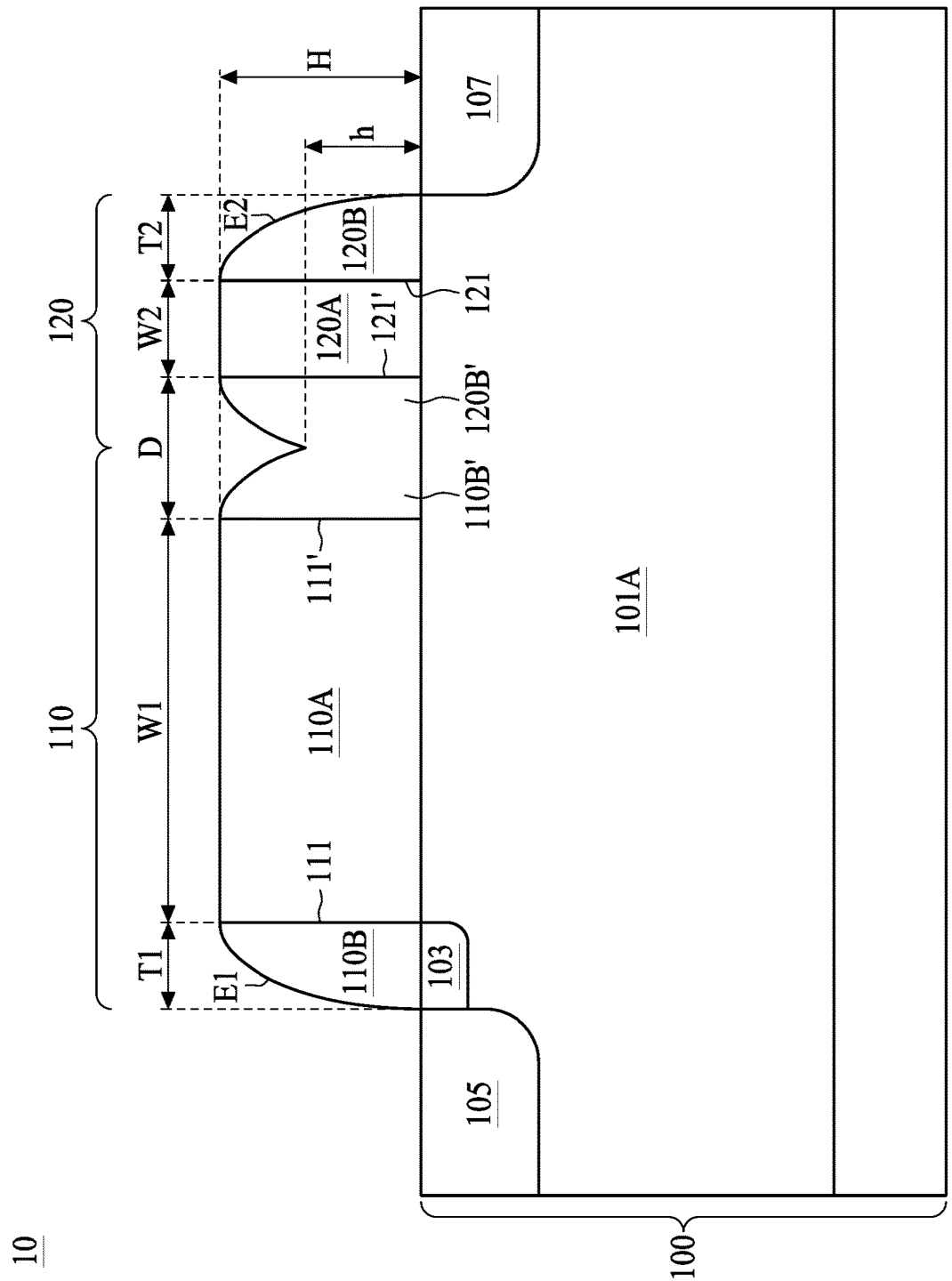
FIG. 1 is a cross sectional view showing a transistor structure, in accordance with some embodiments of the present disclosure.

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure. Throughout the various views and illustrative embodiments, like reference numerals are used to designate like elements. Reference will now be made in detail to exemplary embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, an apparatus in accordance with the present disclosure. It is to be understood that elements not specifically shown or described may take various forms. Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Off-state leakage current and on-state resistance are considered figure of merits of a MOS FET. In deep sub-micron CMOS FET devices, the gate induced drain leakage (GIDL) current increases because the gate oxide insulation layer thickness is reduced to as low as 40 angstroms. The GIDL current typically occurs in thin gate oxide MOS devices and is current between the drain and the substrate. The basis of the GIDL current is band-to-band tunneling that occurs on the surface of the gate-to-drain overlap region. For example, an N+ region underneath a gate edge produces a high vertical electrical field that results in hole generation on the surface of an N+ region underneath the gate by band-to-band tunneling in the device. In a MOS FET, Rds(on) is the total resistance between the source and the drain during the on state. It is an important parameter, determining maximum current rating and loss. To reduce Rds(on), the integrity of the chip and trench technique are considered.

Conventional MOS FET fabricated using self-align drain suffers from severe GIDL problem. Although the self-align drain structure offer scaling advantage for the MOS FET, high off-state leakage current leads to low efficiency for power switch applications.

On the other hand, the conventional MOS FET fabricated using drain extended structure or field plate (FP) produce a high Rds(on). Although the leakage current is comparatively low in the drain extended structure or FP scenario, the Rds(on) is high or the on-state current is low. Furthermore, the FP structure limits the scaling capability of the MOS FET. For example, resist protect oxide (RPO) extends from a top of the gate electrode to a top of the heavily doped drain. The width spanning the RPO extension takes at least over 0.4 μm, rendering difficulties in shrinking device pitch.

Present disclosure provides a transistor structure or a high power transistor structure having a low off-state leakage current and a low on-state resistance. At the same time, the transistor structure or the high power transistor structure described herein provides a modulation function to the electric field between the gate edge and heavily doped region (i.e., source or drain) thereby optimizing the breakdown voltage. A method for manufacturing the transistor structure or the high power transistor structure is also described herein.

FIG. 1 is a cross sectional view showing a transistor structure 10, in accordance with some embodiments of the present disclosure. Note the transistor structure 10 can be a MOS FET in normal power or high power application. Referring to FIG. 1, semiconductor substrate 100 is provided. Semiconductor substrate 100 may include crystalline silicon or other semiconductor materials such as silicon germanium, silicon carbon, or the like. Optionally, an N+ Buried Layer (NBL) is formed in a portion of the substrate 100, wherein NBL is proximate, and below, the top surface of substrate 100. NBL may be formed by implanting an n-type dopant into an intermediate region of substrate 100. For example, NBL may be formed by implanting phosphorous to a concentration between about $1 \times 10^{17}/cm^3$ and about $1 \times 10^{19}/cm^3$, or to a higher concentration. Alternatively, other n-type dopants such as arsenic and antimony may be implanted. In some alternative embodiments, NBL is formed by implanting a surface portion of original substrate 100, and then epitaxially growing a semiconductor layer over NBL.

The semiconductor substrate 100 may be selectively implanted using various implantation steps to form a plurality of implantation regions (e.g., well regions, contact regions, etc.). For example, the semiconductor substrate 100 may be selectively implanted to form a well region 101A, a lightly doped region (LDD) 103, a source region 105, a drain region 107, and a contact region (not shown). The plurality of implantation regions may be formed by selectively masking the semiconductor substrate 100 (e.g., using a photoresist mask) and then introducing high-energy dopants (e.g., p-type dopant species such as boron or n-type dopants such as phosphorous) into exposed areas of the semiconductor substrate 100.

A first gate 110 is disposed over the semiconductor substrate 100 at a position that is laterally arranged between the source region 105 and the drain region 107. The first gate 110 includes a gate electrode 110A that is separated from the semiconductor substrate 100 by a gate dielectric layer (not shown). In some embodiments, the gate dielectric layer may include silicon dioxide ($SiO_2$) or a high-k gate dielectric material and the gate electrode 110A may include polysilicon or a metal gate material (e.g., aluminum). In some embodiments, the first gate 110 may also include sidewall spacers 110B, 110B' disposed on opposing sides of the gate electrode 110A. From a cross sectional perspective, sidewall spacer 110B is at a side 111 of the gate electrode 110A in proximity to the source region 105, whereas sidewall spacer 110B' is at a side 111' of the gate electrode 110A away from the source region 105. In various embodiments, the sidewall spacers 110B, 110B' may include a nitride based sidewall spacer (e.g., comprising SiN) or an oxide-based sidewall spacer (e.g., $SiO_2$, SiOC, etc.). As shown in FIG. 1, the position of the source region 105 is self-aligned with an edge E1 of the sidewall spacer 110B, and an LDD 103 is self-aligned with the side 111 of the gate electrode 110A.

The LDD technique is widely used in high voltage field effect transistor applications to avoid breakdown due to the high electric field intensity at the gate-edge. This technique involves interposing a lightly doped drift region in the drain or source, so as to reduce the electric field intensity to below the breakdown voltage (BV). The length of this LDD region is dependent upon the specific operating range of the transistor. However, in addition to a larger size in the resulting transistor, the drawbacks of an LDD device also include a larger turn-on drain resistance Rds(on), leading to a reduced current drive capability.

A second gate 120 is disposed over the semiconductor substrate 100 at a position that is laterally arranged between the source region 105 and the drain region 107. The second gate 120 includes a gate electrode 120A that is separated from the semiconductor substrate 100 by a gate dielectric layer (not shown). In some embodiments, the gate dielectric layer may include silicon dioxide ($SiO_2$) or a high-k gate dielectric material and the gate electrode 120A may include polysilicon or a metal gate material (e.g., aluminum). In some embodiments, the gate electrode 110A and the gate electrode 120A are composed of the same material. In some embodiments, the second gate 120 may also include sidewall spacers 120B, 120B' disposed on opposing sides of the gate electrode 120A. From a cross sectional perspective, sidewall spacer 120B is at a side 121 of the gate electrode 120A in proximity to the drain region 107, whereas sidewall spacer 120B' is at a side 121' of the gate electrode 120A away from the drain region 107. In various embodiments, the sidewall spacers 120B, 120B' may include a nitride based sidewall spacer (e.g., comprising SiN) or an oxide-based sidewall spacer (e.g., $SiO_2$, SiOC, etc.). As shown in FIG. 1, the position of the drain region 107 is self-aligned with an edge E2 of the sidewall spacer 120B. Note the LDD is formed asymmetric so as to position only under the sidewall spacer 110B of the first gate 110, thereby reducing Rds(on).

Referring to FIG. 1, the sidewall spacer 110B' of the first gate 110 and the sidewall spacer 120B' of the second gate 120 are merged as a continuous sidewall spacer. The merged portion is referring to the portion of the sidewall spacer 110B' and the sidewall spacer 120B' directly in contact with each other. For example, the merged portion in FIG. 1 possesses a height h, and each of the first gate 110 and the second gate 120 possesses a height H. The height H can be measured as a vertical dimension of the gate electrode 110A or 120A. In some embodiments, the height h is more than one-half of the height H. For example, in a 40 nm transistor technology node, the height H is about 80 nm, and the height h could be designed to be more than 40 nm, for example, about 50 nm.

The determination of the height h could be related to two factors. First, the deposition operation of the sidewall spacer compatible to the corresponding technology node; and second, the implantation energy used in the subsequent self-aligning source and drain region. As a result, in order to prevent the dopant contamination into the channel region underlying the sidewall spacer 110B' and 120B', the height h of the merged portion shall be thick enough to resist the high energy dopant penetration, and at the same time, the gate electrodes 110A and 120A shall be separated to distinguish itself from the drain extended structure counterpart.

In some embodiments, a gate width W1 of the first gate 110 is longer than a gate width W2 of the second gate 120, as illustrated in FIG. 1. However, this is not a limitation to the present disclosure since the gate width W1 of the first gate 110 and the gate width W2 of the second gate 120 could be substantially identical. In some embodiments, the smaller gate width among two gates 110 and 120 could be the critical dimension of the corresponding technology node. For example, in a 40 nm technology node, the gate width W2 of the second gate 120 could be about 40 nm, and the gate width W1 of the first gate 110 could be either 40 nm or greater than 40 nm.

In some embodiments, a separation D between the gate electrode 110A and the gate electrode 120A could also be equal to or greater than the critical dimension of the corresponding technology node. For example, the separation D illustrated in FIG. 1 could be 50 nm in the 40 nm technology node. Compared to the conventional FP or drain extended counterpart, where the separation between an edge of the first gate and an edge of the drain is more than about 300 nm, the same separation in the present disclosure can be controlled under 150 nm. A more compact device pitch can thus be obtained, compared to the FP or drain extended counterpart.

Also note in FIG. 1, a thickness T1 of the sidewall spacer 110B at the side 111 of the first gate 110 is substantially identical to a thickness T2 of the sidewall spacer 120B at the side 121 of the second gate 120. The thickness of the sidewall spacer 110B and 120B is determined by various deposition conditions. Since the sidewall spacer 110B, 110B', 120B, 120B' are formed in a single blanket deposition operation followed by a planarization operation, the thickness of the sidewall spacer 110B and 120B could be substantially identical.

Figure 2:
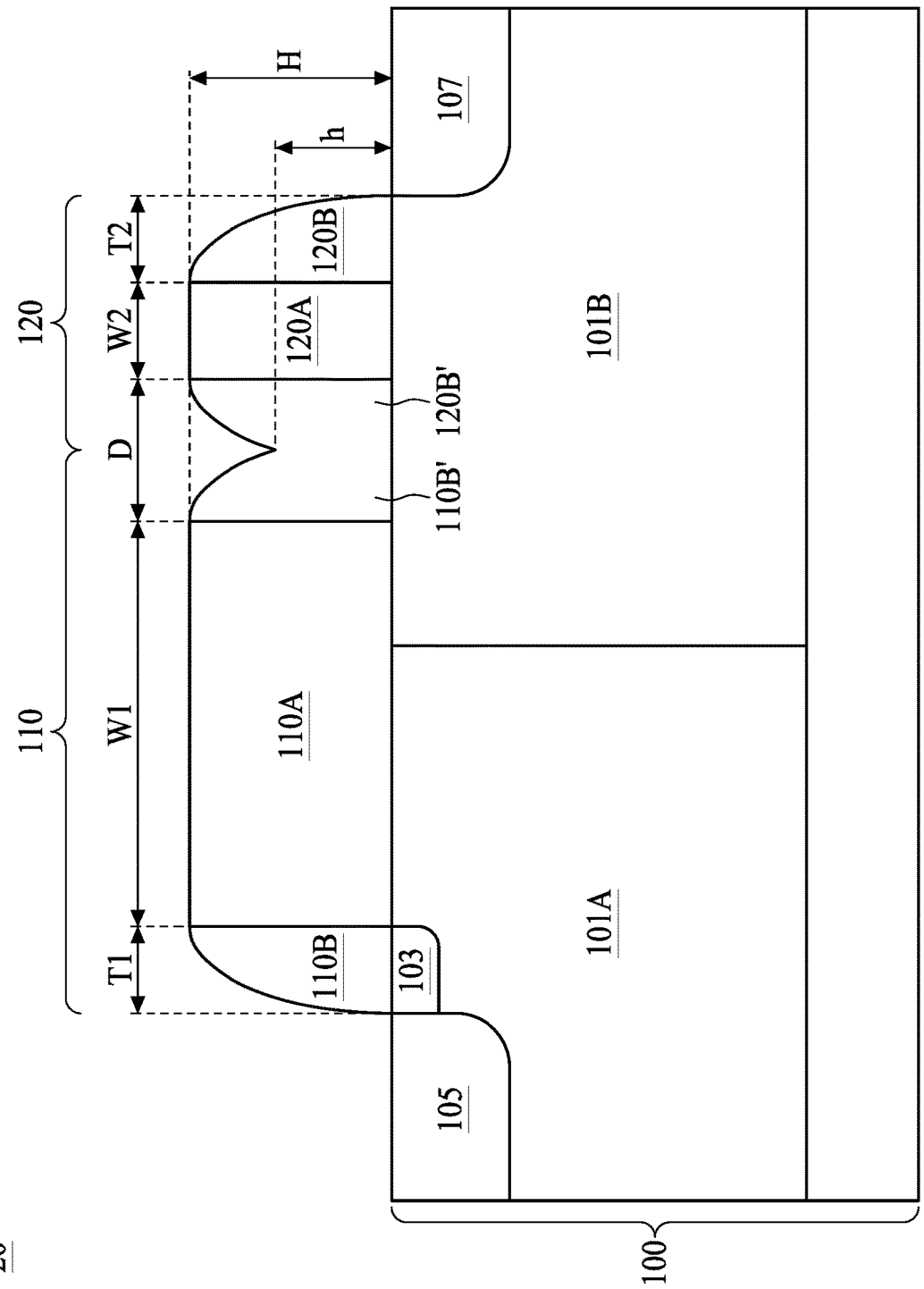
FIG. 2 is a cross sectional view showing a high power transistor structure, in accordance with some embodiments of the present disclosure.

FIG. 2 is a cross sectional view showing a high power transistor structure 20, in accordance with some embodiments of the present disclosure. The difference between the high power transistor structure 20 and the transistor structure 10 of FIG. 1 is that an additional well region 101B is formed surrounding the drain region 107. The well region 101B possesses an opposite conductive type to the well region 101A surrounding the source region 105. In some embodiments, the well region 101B is an N-well region and the well region 101A is a P-well region. For example, N-Well region is formed in substrate 100, and extends from the top surface of substrate 100 down to contact NBL. N-well region may be formed, for example, by implanting an n-type impurity into substrate 100. P-well region is also formed over NBL, and may extend from the top surface of substrate 100 to NBL. P-well region may have a concentration between about $10^{15}/cm^3$ and about $10^{17}/cm^3$, although a higher or a lower concentration may be used. The edge of N-well region contacts the edge of p-well region.

The high power MOS FET 20 illustrated in FIG. 2 is an n-type power MOSFET. In accordance with alternative embodiments, a p-type power MOSFET may be formed. The p-type power MOSFET may have a structure similar to the structure shown in FIG. 2, except that the conductivity types of regions are inverted from the conductivity types of the like components.

Figure 3:
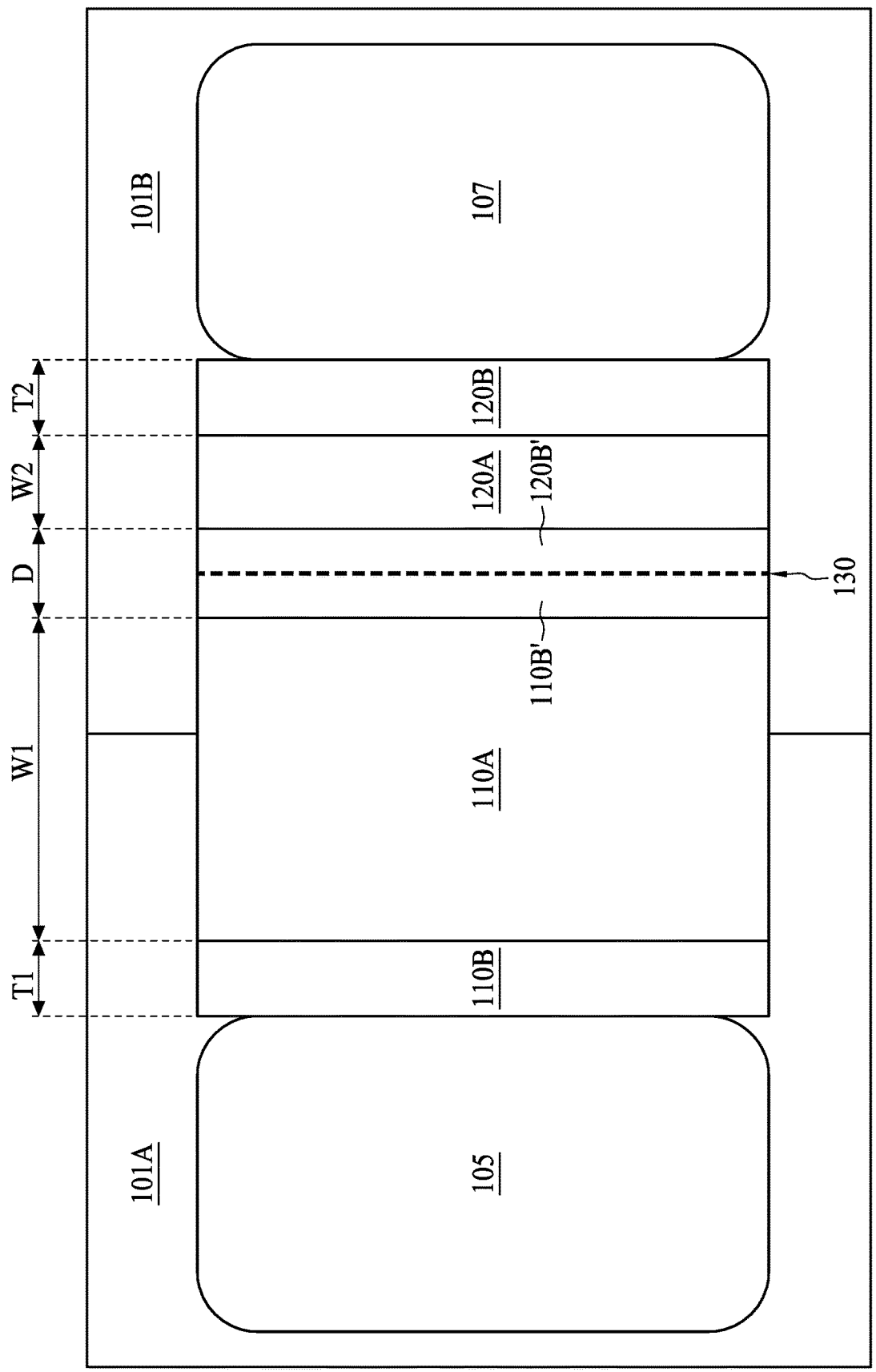
FIG. 3 is a top view showing a high power transistor structure, in accordance with some embodiments of the present disclosure.

Referring to FIG. 3, FIG. 3 is a top view showing a high power transistor structure 20, as illustrated in FIG. 2. As previously discussed, the well region 101A of a first conductivity type is abutting the well region 101B of a second conductivity type in the substrate (not shown in FIG. 3). A first stripe 110A (or the first gate electrode 110A) and a second stipe 110B (or the first gate electrode 110A) are laterally positioned between a source region 105 and a drain region 107. The first stripe 110A includes two sidewall spacers 110B and 110B' positioned at opposite sides along the longitudinal direction of the first stripe 110A. The second stripe 120A includes two sidewall spacers 120B and 120B' positioned at opposite sides along the longitudinal direction of the second stripe 120A. The sidewall spacer 110B' and the sidewall spacer 120B' are merged or directly in contact with each other. As denoted in FIG. 3, a dimpled recess 130 is shown by dotted line to be the local minimum of the merged portion of the sidewall spacer 110B' and the sidewall spacer 120B'. In some embodiments, the dimpled recess 130 is approximately half of the separation D between the first stripe 110A and the second stripe 120A.

As opposed to the merged sidewall spacers 110B' and 120B', FIG. 3 shows an un-merged sidewall spacer 110B and an un-merged sidewall spacer 120B at the opposite sides of the first and second stripes 110A, 120A, respectively. The un-merged sidewall spacers 110B and 120B are closer to the source region 105 and the drain region 107, respectively, than the merged sidewall spacers 110B' and 120B'. In some embodiments, due the merging nature of the sidewall spacers 110B' and 120B', the separation D between the first stripe 110A and the second stripe 120A is smaller than 2 times of the thickness T1 of the un-merged sidewall spacer 110B. In some embodiments, the separation D between the first stripe 110A and the second stripe 120A is smaller than 2 times of the thickness T2 of the un-merged sidewall spacer 120B.

The source region 105 is self-aligned to the un-merged sidewall spacer 110B due to the respective edges of the two along the longitudinal direction are aligned. Same configuration applies to the drain region 107 and the un-merged sidewall spacer 120B.

Figure 4:
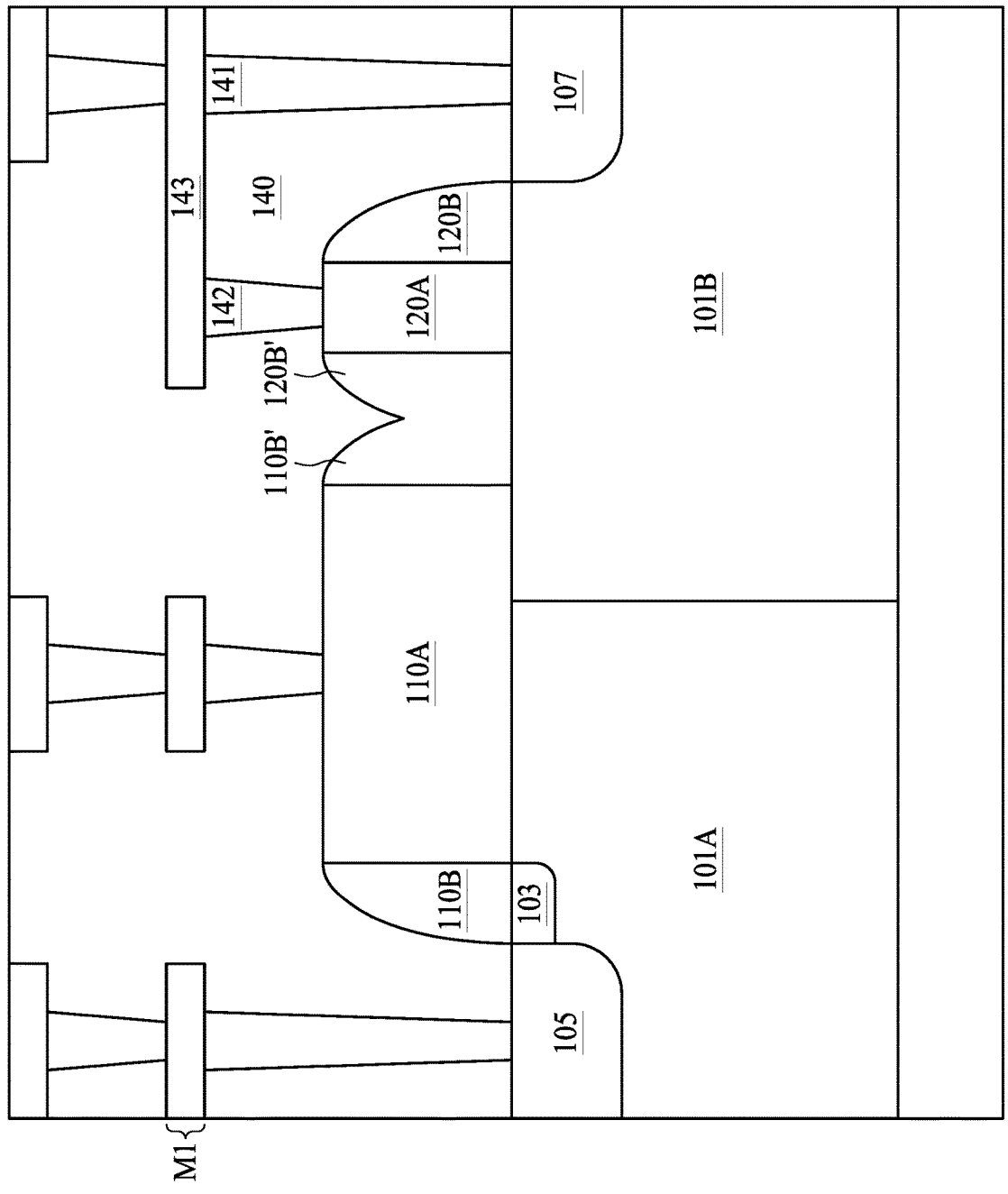
FIG. 4 is a cross sectional view showing a high power transistor structure, in accordance with some embodiments of the present disclosure.
Figure 5:
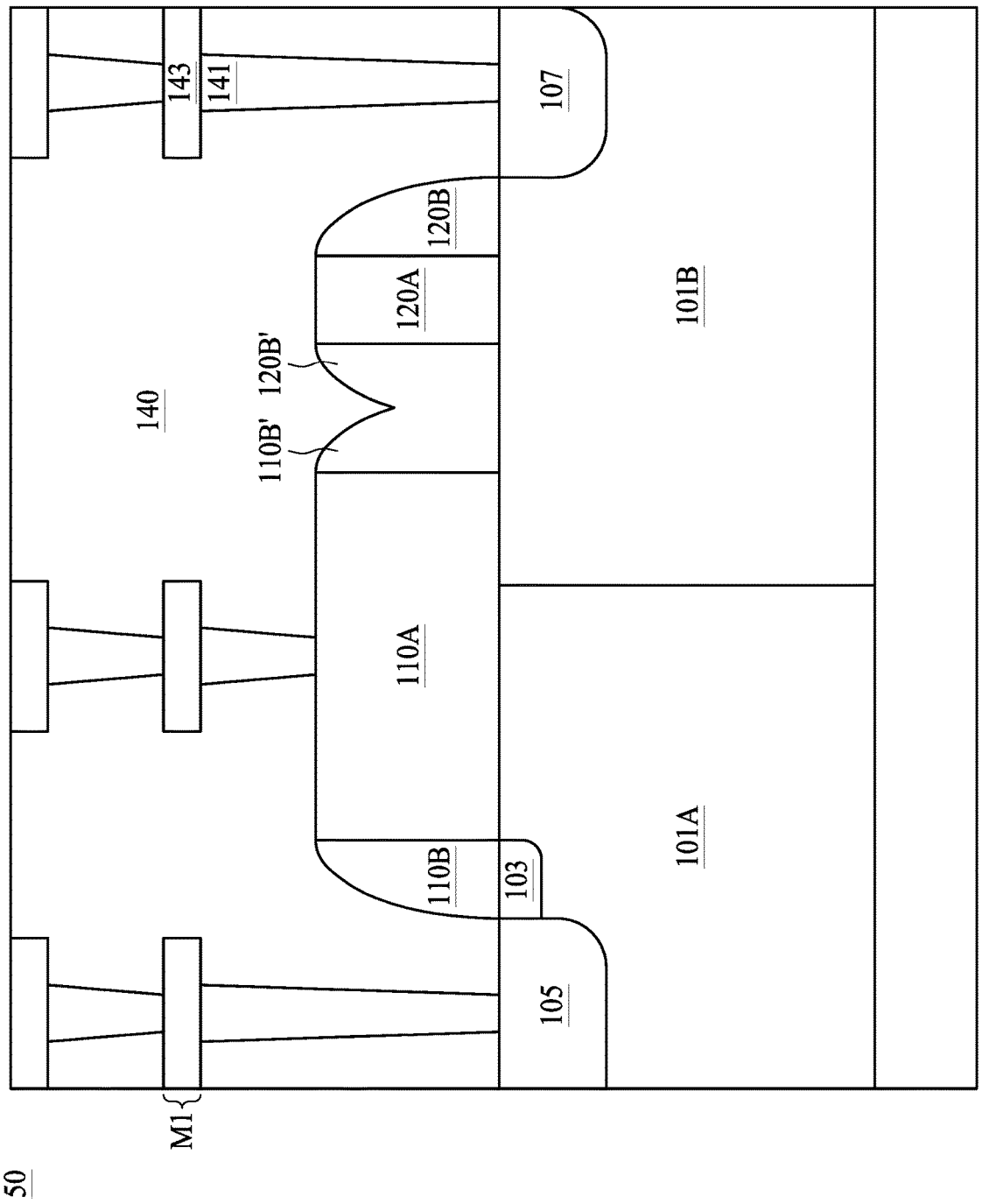
FIG. 5 is a cross sectional view showing a high power transistor structure, in accordance with some embodiments of the present disclosure

Referring to FIG. 4 and FIG. 5, FIG. 4 is a cross sectional view showing a high power transistor structure 40, in accordance with some embodiments of the present disclosure. FIG. 5 is a cross sectional view showing a high power transistor structure 50, in accordance with some embodiments of the present disclosure. In FIG. 4, the remaining components of power MOS FET 40 are formed. The exemplary components include source/drain silicide regions, contact etch stop layer, contact plugs 141 and 142, Inter-Layer Dielectric (ILD) 140, and metal lines 143 in bottom metal layer M1. It is appreciated that the contact plug 141 picking up the drain region 107 and contact plug 142 picking up the second gate electrode 120A are connected or electrically coupled via the bottom metal layer M1. Bottom metal layer M1 is the lowest metal layer of a plurality of metal layers, which may be formed in low-k dielectric layers. For example, metal lines 143 may be formed in low-k dielectric layer. In accordance with embodiments, the second gate electrode 120A is formed under bottom metal layer M1. Furthermore, the top surfaces of second gate electrode 120A are lower than the top edges of contact plugs 141 and 142. Contact plugs 141 and 142 may be tungsten plugs in some exemplary embodiments.

The coupling of the drain region 107 and the second gate electrode 120A provides identical bias, e.g., connected to a same voltage source, in the aforesaid regions. If the second gate electrode 120A and the drain region 107 are applied to the same bias, extra accumulative charge would be generated underneath the second gate electrode 120A, and thus providing a greater accumulative current, obtaining lower Rds(on). Biasing the second gate electrode 120A by the source voltage provides a high power MOS FET with a low on-state resistance Rds(on) and low dynamic power dissipation (e.g., low Rds(on)*Qgd vs. Breakdown Voltage). The low dynamic power dissipation provides for good performance during high frequency switching applications.

However, the coupling between the drain region 107 and the second gate electrode 120A through the metal lines 143 of the bottom metal layer M1 is not a limitation to the scope of the present disclosure. As shown in FIG. 5, other configuration such as the second gate electrode 120A not connected to any bias but in a floating position, is also encompassed in the contemplated scope of the present disclosure. In addition, other configuration such as the second gate electrode 120A connected to the first gate electrode 110A (not shown), is also encompassed in the contemplated scope of the present disclosure. By electrically coupling the second gate electrode 120A to the first gate electrode 110A, the second gate electrode 120A is biased by the first gate voltage. Biasing the second gate electrode 120A by the first gate voltage provides high power MOS FET device with a low Rds(on) vs. breakdown voltage.

According to the present disclosure, the breakdown voltage of high power MOS FET 40 and 50 is increased. The power MOS FETs including the second gate 120 have breakdown voltage significantly higher than the breakdown voltages of the power MOS FETs not including the second gate 120. For example, simulation results indicated that a power MOS FET including the second gate 120 has a breakdown voltage equal to about 30 V, and a similar power MOSFET not including the field plate has a breakdown voltage equal to about 15 V.

Figure 6:
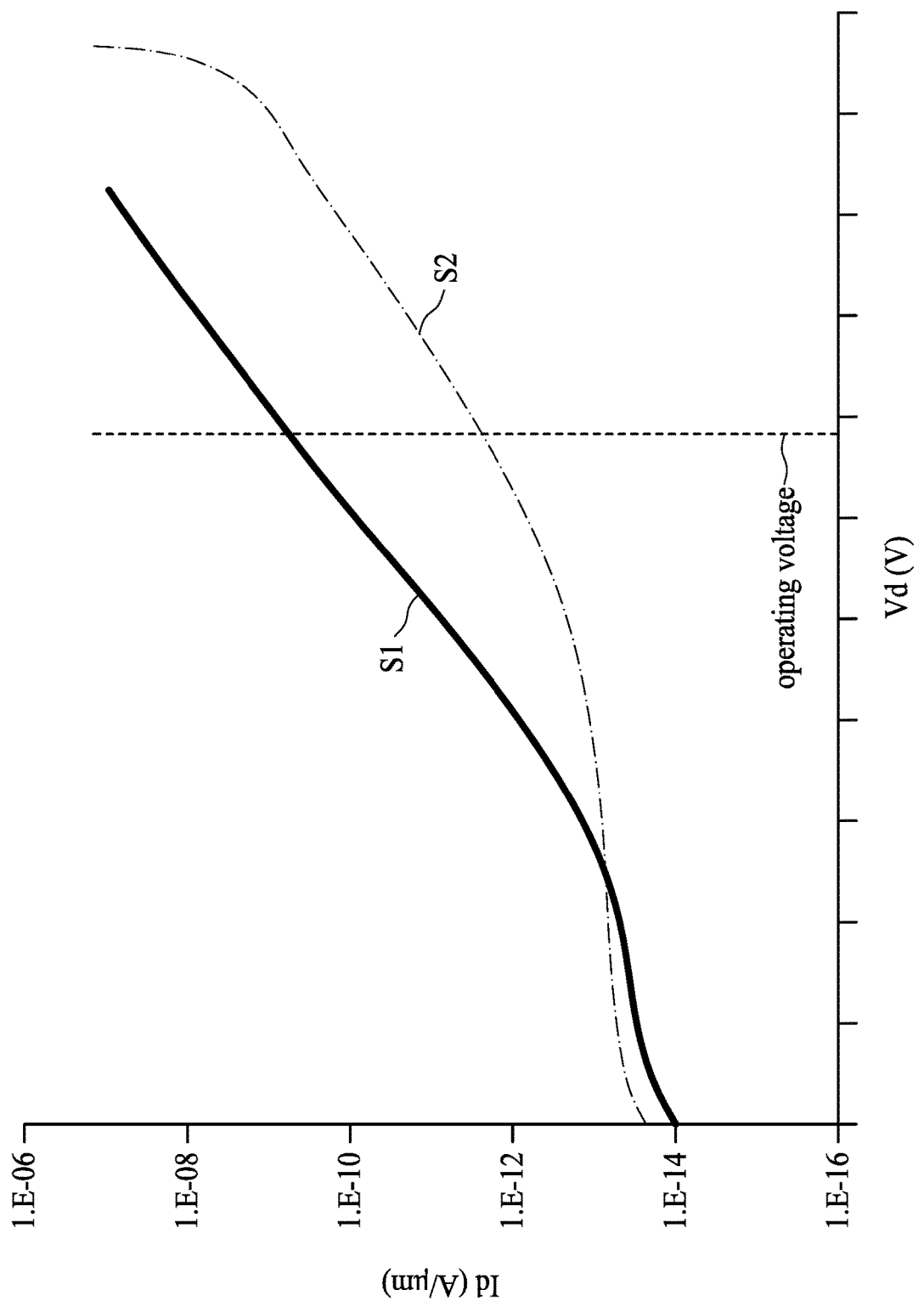
FIG. 6 is a diagram showing drain current with respect to drain voltage, in accordance with some embodiments of the present disclosure.
Figure 7:
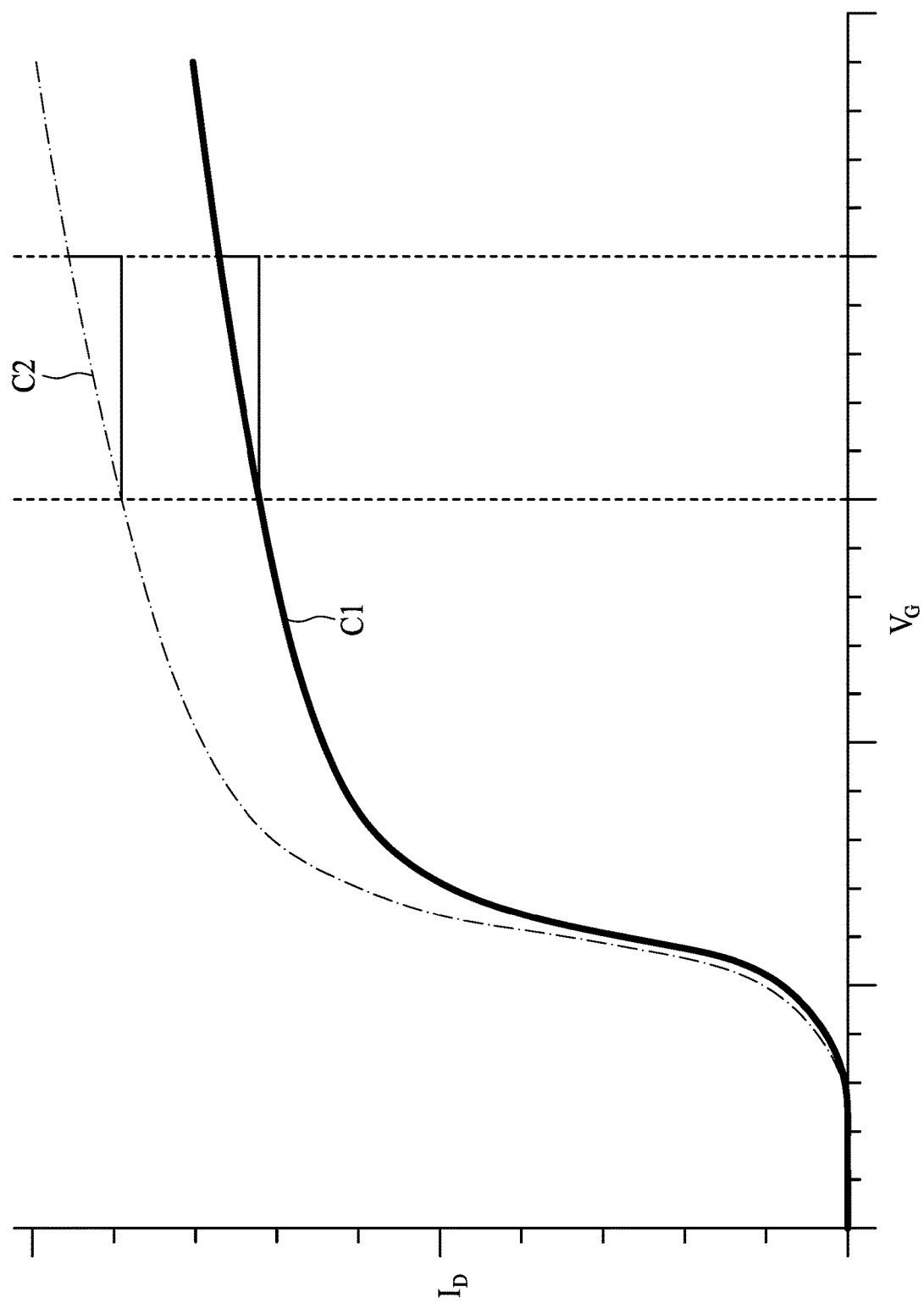
FIG. 7 is a diagram showing drain current with respect to gate voltage, in accordance with some embodiments of the present disclosure.

FIG. 6 and FIG. 7 show the measurement results of the device having the transistor structure described herein. FIG. 6 is a diagram showing drain current with respect to drain voltage, in accordance with some embodiments of the present disclosure. In FIG. 6, curve S1 represents a conventional device having a drain self-aligned to a first gate between source region and drain region, and curve S2 represents a device having a first gate 110 and a second gate 120 between the source region 105 and the drain region 107, as described in the present disclosure. At a fixed operating voltage Vd, the conventional device demonstrate a greater leakage current Id around 1E-9A/µm while the device of the present disclosure produce a lower leakage current Id around 1E-12A/µm.

FIG. 7 is a diagram showing drain current with respect to gate voltage, in accordance with some embodiments of the present disclosure. In FIG. 7, curve C1 represents a conventional drain extended structure high power MOS FET, and curve C2 represents a device having a first gate 110 and a second gate 120 between the source region 105 and the drain region 107, as described in the present disclosure. The reciprocals of slops of the two curves C1 and C2 are correlated to the on-state resistance Rds(on). It is shown that curve C1 demonstrate a greater Rds(on) than the curve C1.

Figure 8:
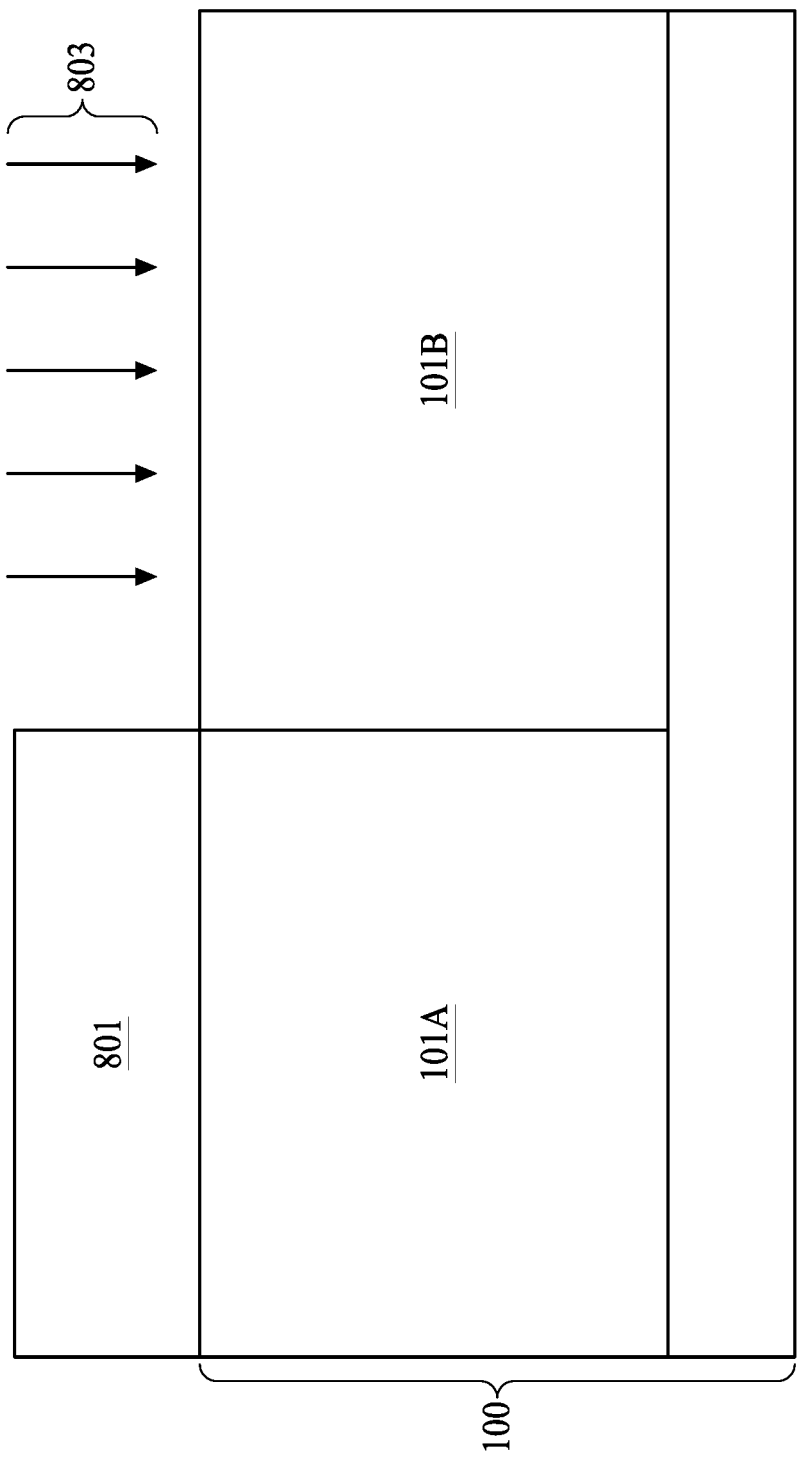
FIGS. 8-14 are cross sectional views showing a method for manufacturing a high power transistor structure, in accordance with some embodiments of the present disclosure.

FIGS. 8-14 are cross sectional views showing a method for manufacturing a high power transistor structure, in accordance with some embodiments of the present disclosure. In FIG. 8, an N-well 101B and a P-well 101A are formed, by implantation operations, in a semiconductor substrate 100. For example, a masking layer 801 is selectively patterned to expose portions of the semiconductor substrate 100 into which high-energy dopants 803 are subsequently implanted to form N-well 101B. It will be appreciated that the implantation regions as shown are one example of possible implantation regions and that the semiconductor substrate 100 may comprise other configurations of implantation regions.

Figure 9:
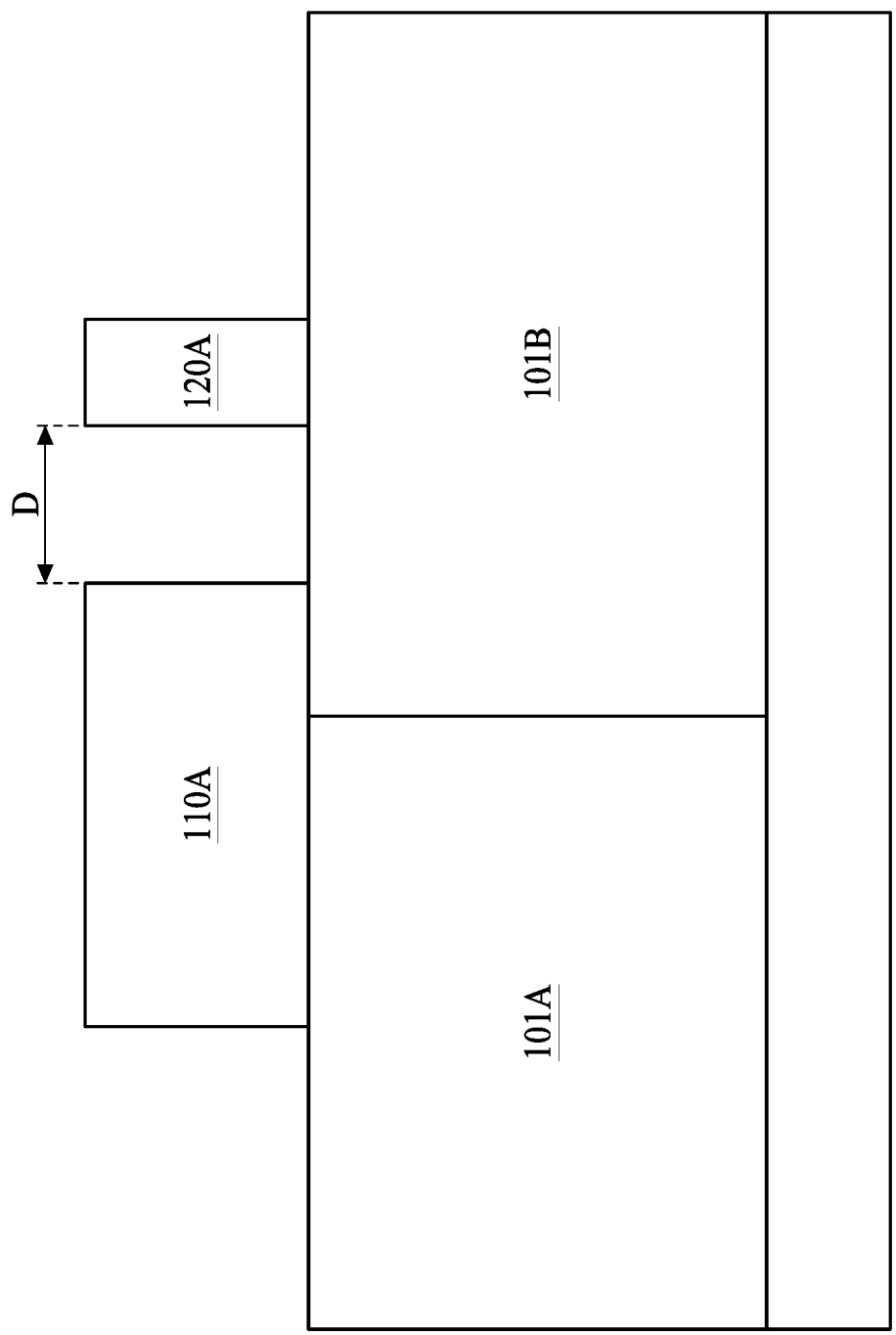

In FIG. 9, a first polysilicon stripe 110A (or the first gate electrode previously described) and a second polysilicon stripe 120A (or the second gate electrode previously described) are patterned over the semiconductor substrate 100. A separation D between the first polysilicon stripe 110A and the second polysilicon stripe 120A is predetermined according to aforementioned factors. However, materials such as doped polysilicon, a metal, a metal alloy, or the like can replace the polysilicon for the formation of the first stripe and the second stripe. In a metal gate MOS FET, the polysilicon stripes 110A and 110B are first patterned and then replace by metal materials in subsequent operations.

Figure 10:
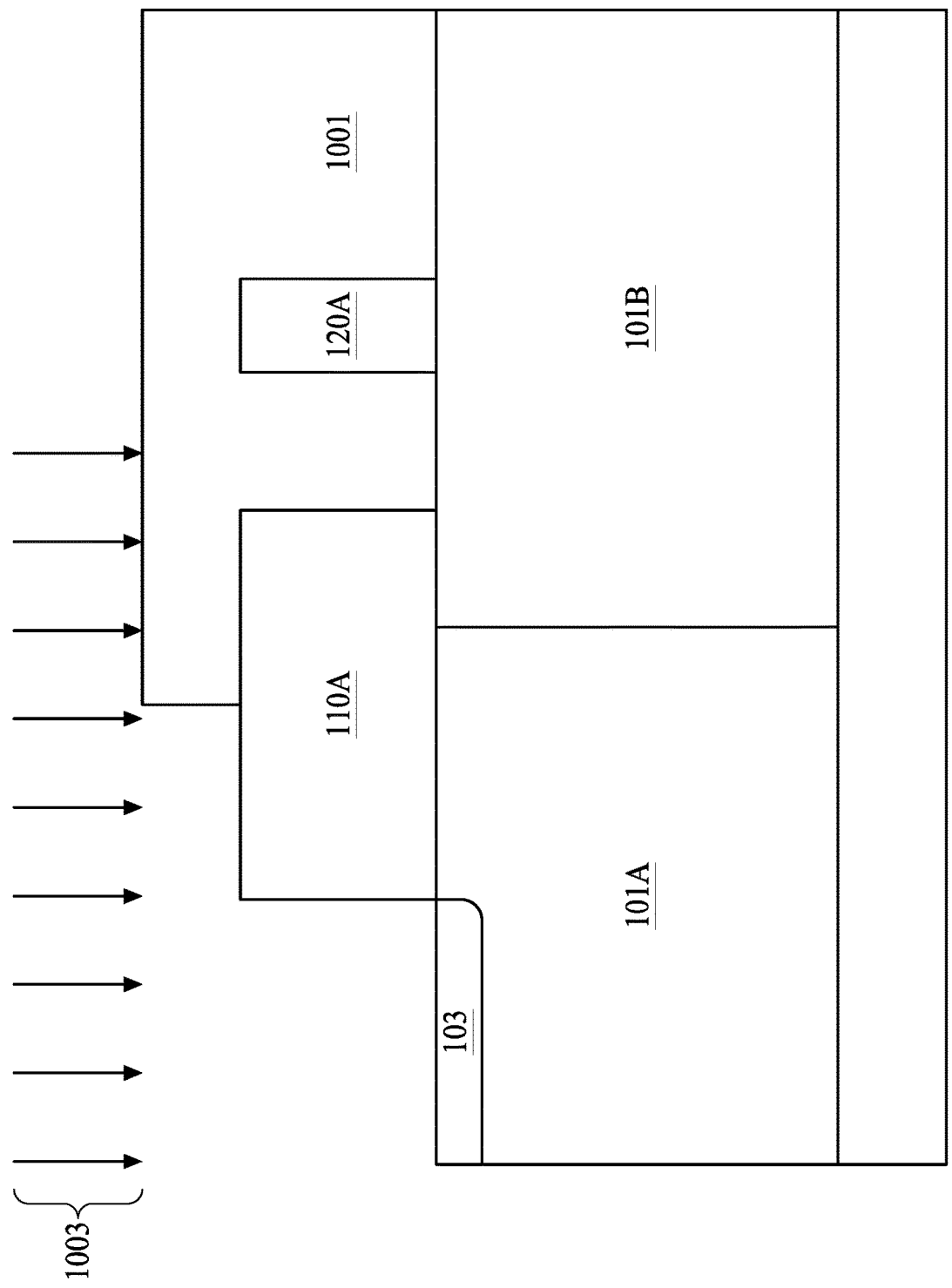

In FIG. 10, an LDD 103 is formed by implanting high-energy dopants 1003 in an implantation operation using the first polysilicon stripe 110A as a hardmask. A photoresist layer 1001 is spun over the semiconductor substrate 100 so as to cover the separation D between the first polysilicon stripe 110A and the second polysilicon stripe 120A. The LDD 103 is self-aligned with a side 111 of the first polysilicon stripe 110A.

Figure 11:
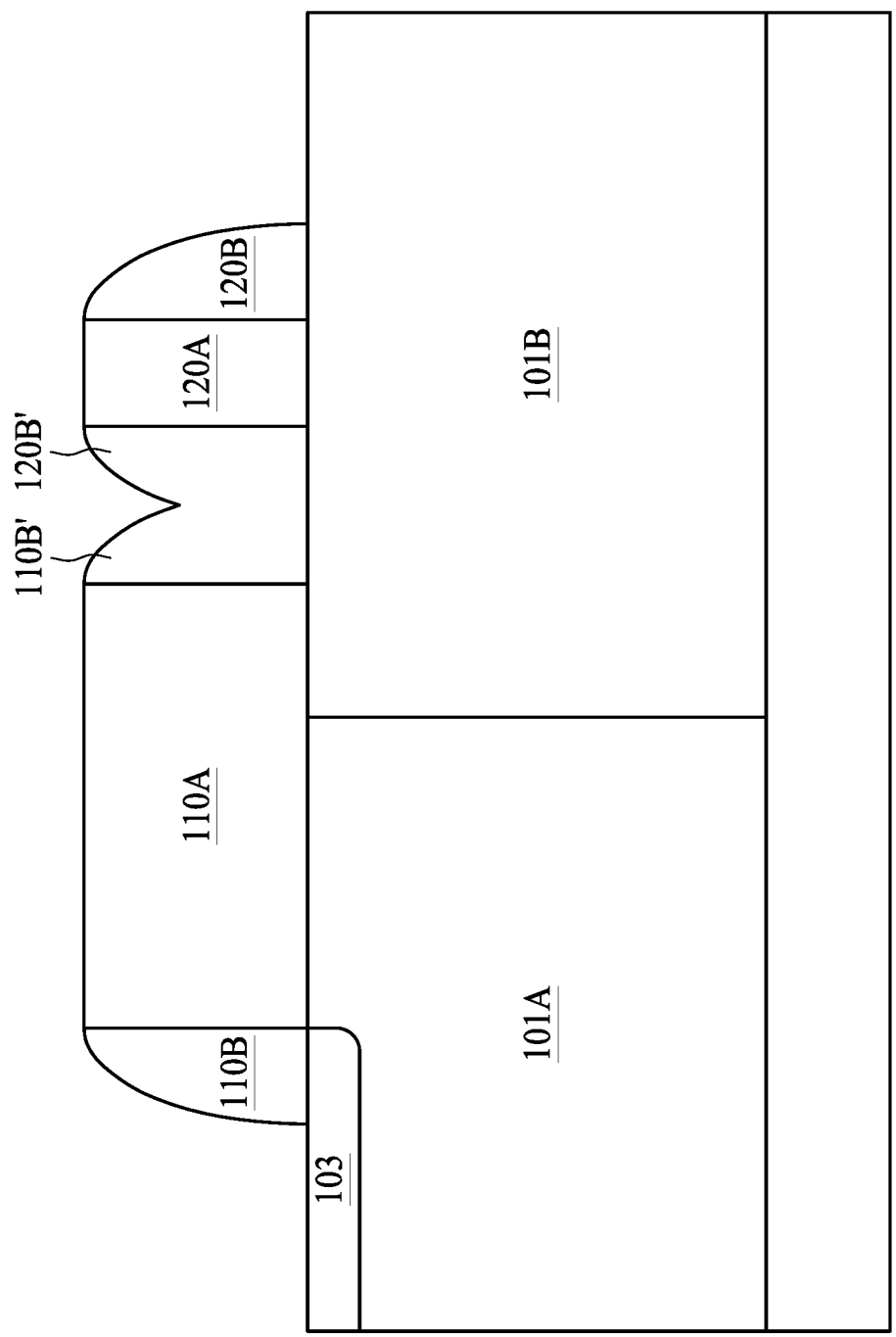

In FIG. 11, sidewall spacers 110B, 110B', 120B', and 120B are blanket deposited over the first polysilicon stripe 110A and the second polysilicon stripe 120A, followed by a removal operation exposing a top surface of the first polysilicon stripe 110A and a top surface of the second polysilicon stripe 120A from the as-deposited sidewall spacer layer. As previously discussed, the sidewall spacers 110B' and 120B' are merged due to the calculation of a suitable separation D. In other words, the sidewall spacers 110B' and 120B' form a continuous body of a homogeneous material. In various embodiments, the sidewall spacers 110B, 110B', 120B', and 120B may include a nitride based sidewall spacer (e.g., comprising SiN) or an oxide-based sidewall spacer (e.g., $SiO_2$, SiOC, etc.).

Figure 12:
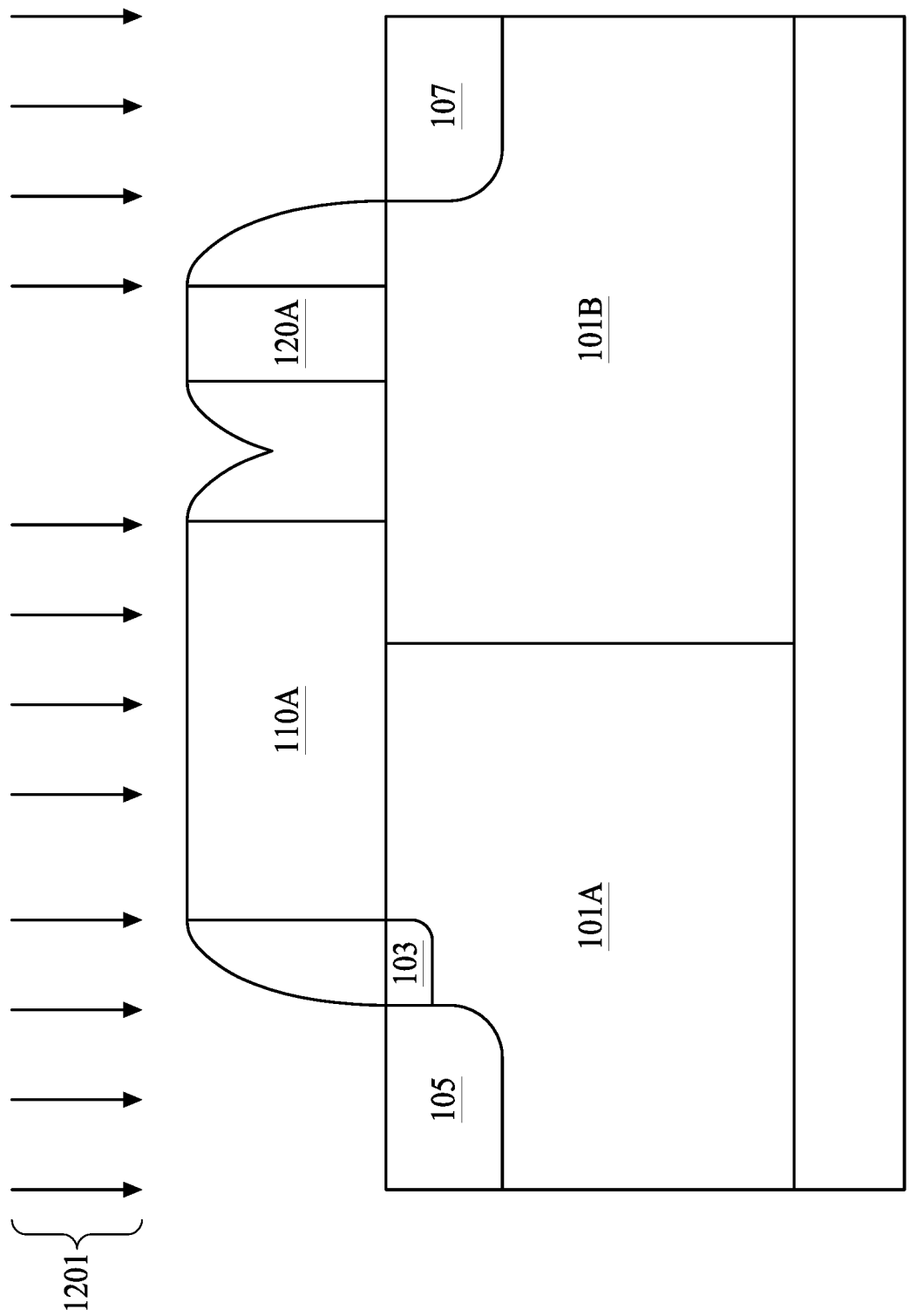

In FIG. 12, a source region 105 and a drain region 107 are formed in a self-align fashion using the first polysilicon stripe 110A, the second polysilicon stripe 120A, and the sidewall spacers 110B, 110B', 120B', and 120B as hard mask. Source region 105, drain region 107, and pickup regions (not shown) may be formed by implanting an n-type dopant 1201 such as phosphorous to a concentration between about $1 \times 10^{19}/cm^3$ and about $2 \times 10^{21}/cm^3$, for example. The implantation energy adopted for the n-type dopant 1201 can be a determining factor of the separation D since the merged portion of the sidewall spacers 110B', 120B' shall be sufficiently thick in order to prevent the high energy dopant from contaminating the channel region underlying sidewall spacers 110B', 120B'.

Figure 13:
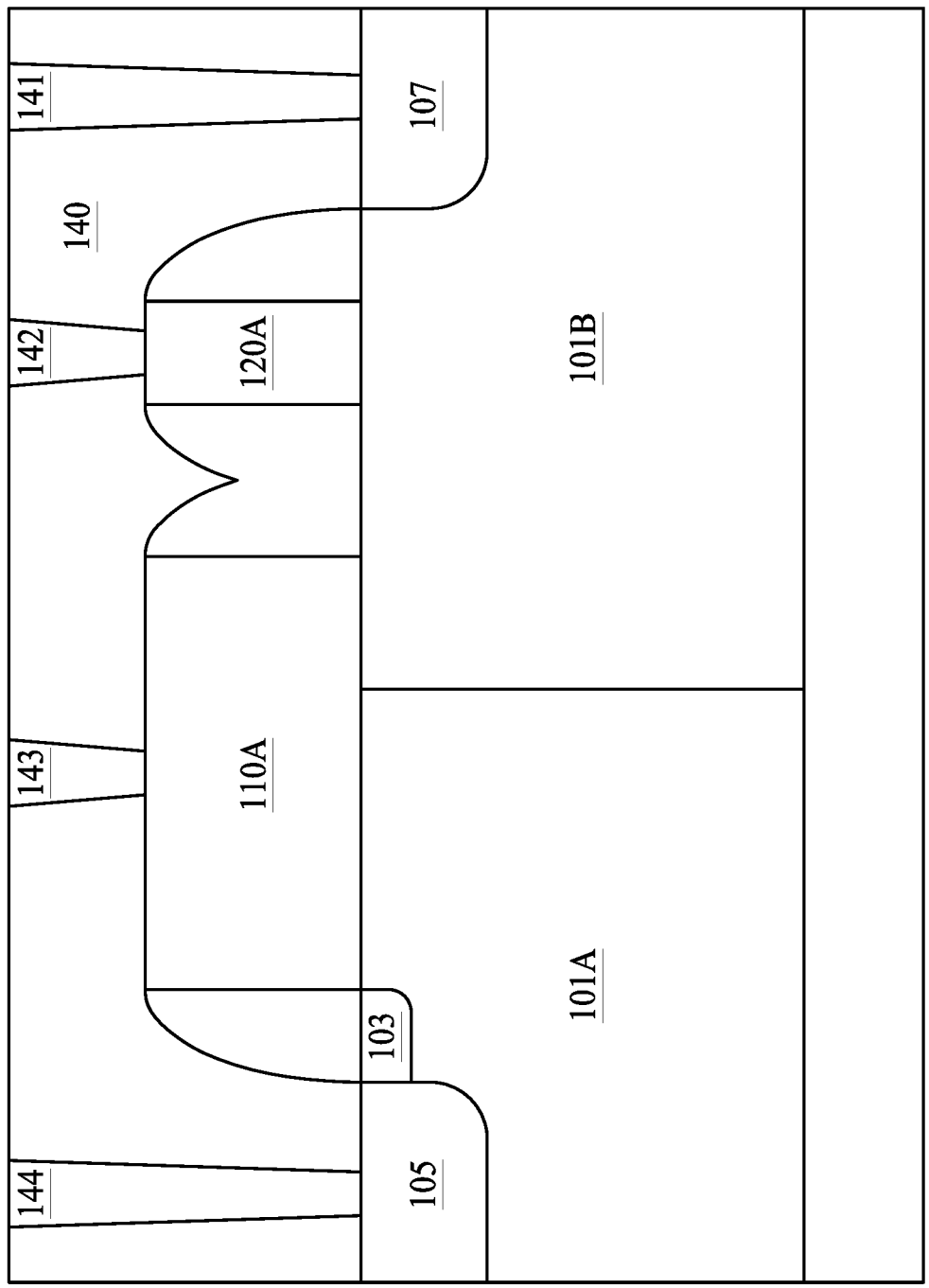

In FIG. 13, contact plug 141 picking up the drain region 107 and contact plug 142 picking up the second gate electrode 120A are formed in the ILD 140. Also note the contact plug 143 picking up the first gate electrode 110A and contact plug 144 picking up the source region 105 are formed in the ILD 140.

Figure 14:
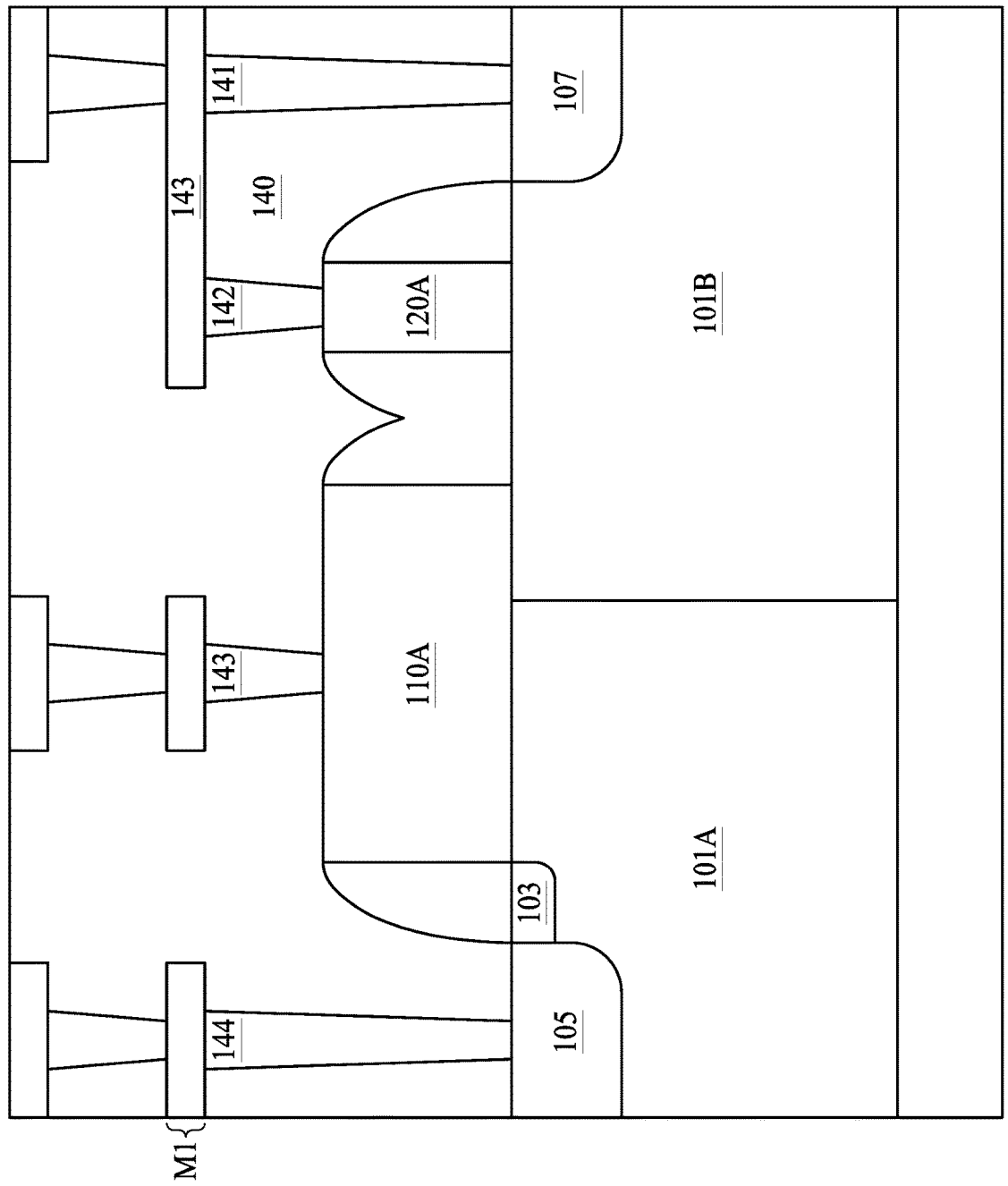

In FIG. 14, contact plug 141 and contact plug 142 are connected or electrically coupled via the bottom metal layer M1. Bottom metal layer M1 is the lowest metal layer of a plurality of metal layers, which may be formed in low-k dielectric layers. For example, metal lines 143 may be formed in low-k dielectric layer. In accordance with embodiments, the second gate electrode 120A is formed under bottom metal layer M1. Furthermore, the top surfaces of second gate electrode 120A are lower than the top edges of contact plugs 141 and 142. Contact plugs 141 and 142 may be tungsten plugs in some exemplary embodiments. In another embodiment, the second gate electrode 120A is floating. In still another embodiment, the second gate electrode 120A is electrically coupled to the first gate electrode 110A via the bottom metal layer M1, as described previously.

In some embodiments, a transistor structure includes a substrate, a first gate over the substrate, a second gate over the substrate and laterally in contact with the first gate, a first conductive region of a first conductivity type in the substrate, self-aligning to a side of the first gate, and a second conductive region of the first conductivity type in the substrate, self-aligning to a side of the second gate.

In some embodiments, a high power transistor structure includes a substrate, a source region in the substrate, a drain region in the substrate, a first strip between the source region and the drain region, a second stripe between the source region and the drain region, and a merged sidewall spacer stripe between the first strip and the second stripe.

In some embodiments, a method for manufacturing a transistor structure includes patterning a first polysilicon stripe and a second polysilicon stripe separated from the first polysilicon stripe by a predetermined distance on a substrate, forming a sidewall spacer over the first polysilicon stripe and the second polysilicon stripe, wherein the predetermined distance is so determined to render a continuous sidewall spacer between the first polysilicon stripe and the second polysilicon stripe, and forming a source region self-aligning to the first polysilicon stripe and a drain region self-aligning to the second polysilicon stipe by an implantation operation.

Although the present invention and its advantages have been described in detail, it should be understood that various changes, substitutions and alterations can be made herein without departing from the spirit and scope of the invention as defined by the appended claims. For example, many of the processes discussed above cancan be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or to steps.

What is claimed is:

1. A transistor structure, comprising:
a substrate, comprising an N+ buried layer;
a first gate extending along a longitudinal direction over the substrate, the first gate comprising a gate electrode, wherein the first gate has a first length along the longitudinal direction;
a second gate over the substrate and apart from the first gate, wherein the second gate has a second length along the longitudinal direction and a second width along a horizontal direction orthogonal to the longitudinal direction, wherein the second length is greater than the second width, and the second length substantially equals the first length;
a source region of a first conductivity type in the substrate, aligning to an edge in proximity to a side of the first gate, having a source length substantially equals the first length;
a P-type well surrounding the source region;
a drain region of the first conductivity type in the substrate, aligning to an edge in proximity to a side of the second gate, and having a drain length substantially equals the first length;
an N-type well surrounding the drain region, wherein the N-type well has an N-well length along the longitudinal direction, the N-well length is greater than the second length of the second gate, the second gate is entirely within a vertical projection area of the N-type well, a sidewall of the N-type well directly contacts a sidewall of the P-type well, and a bottom surface of the P-type well and a bottom surface of the N-type well are substantially at a same depth from the first gate;
a metal layer electrically coupling the drain region and the second gate to a drain bias; and
a lightly doped region in the P-type well, aligning to a sidewall of the gate electrode of the first gate,
wherein a boundary between the P-type well and the N-type well is under the first gate, wherein
the drain length is measured from one edge of the drain region to an opposite edge of the drain region along the longitudinal direction;
the source length is measured from one edge of the source region to an opposite edge of the source region along the longitudinal direction;
the second length is measured from one side of the second gate to an opposite side of the second gate across the longitudinal direction;
the second width is measured from one edge of the second gate to an opposite edge of the second gate across the horizontal direction; and
the N-well length is measured from one side of the N-type well to an opposite side of the N-type well across the longitudinal direction.

2. The transistor structure of claim 1, further comprising a continuous sidewall spacer between the first gate and the second gate, wherein the continuous sidewall spacer has a continuous sidewall spacer length along the longitudinal direction and a continuous sidewall spacer width along the horizontal direction, the continuous sidewall spacer length is measured from one side of the continuous sidewall spacer to an opposite side of the continuous sidewall spacer across the longitudinal direction, the continuous sidewall spacer width is measured from one edge of the continuous sidewall spacer to an opposite edge of the continuous sidewall spacer across the horizontal direction, the continuous sidewall spacer length is greater than the continuous sidewall spacer width.

3. The transistor structure of claim 2, wherein the continuous sidewall spacer is entirely within a vertical projection area of the N-type well from top view perspective.

4. The transistor structure of claim 2, further comprising a first un-merged sidewall spacer at a side proximal to the first gate opposite to another side proximal to the continuous sidewall spacer.

5. The transistor structure of claim 4, wherein the first un-merged sidewall spacer is entirely within a vertical projection area of the P-type well, and the first un-merged sidewall spacer is free from overlapping with the N-type well from top view.

6. The transistor structure of claim 4, wherein the lightly doped region is free from being under a projection area of the first gate and a projection area the second gate.

7. The transistor structure of claim 6, wherein a portion of the P-type well is between the lightly doped region and the N-type well.

8. The transistor structure of claim 6, wherein the lightly doped region is spaced away from the N-type well.

9. The transistor structure of claim 6, the continuous sidewall spacer comprises a dimple recess.

10. The transistor structure of claim 9, further comprising an inter layer dielectric material filling the dimple recess, wherein the inter layer dielectric material is free from being in direct contact with the lightly doped region, the inter layer dielectric material is in direct contact with the continuous sidewall spacer and the first un-merged sidewall spacer.

11. The transistor structure of claim 6, wherein a bottom of the lightly doped region is at a level above a bottom of the source region.

12. The transistor structure of claim 6, wherein a bottom of the lightly doped region is at a level above a bottom of the drain region.

13. The transistor structure of claim 6, wherein a bottom of the lightly doped region is at a level above the bottom surface of the P-type well.

14. The transistor structure of claim 6, wherein a bottom of the lightly doped region is at a level above the bottom surface of the N-type well.

15. The transistor structure of claim 6, wherein a first edge of the lightly doped region is aligned with a first edge of the first un-merged sidewall spacer, a second edge of the lightly doped region is aligned with a second edge of the first un-merged sidewall spacer and a sidewall of the first gate, the first edge of the lightly doped region is apart from the second edge of the lightly doped region, and the lightly doped region is directly adjacent to the source region.

16. The transistor structure of claim 4, wherein the source region is free from being under a projection area of the first un-merged sidewall spacer.

17. A transistor structure, comprising:
a substrate, comprising an N+ buried layer;
a first gate stripe extending along a longitudinal direction over the substrate;
a second gate stripe over the substrate, separated from the first gate stripe by a predetermined distance;
a continuous sidewall spacer between the first gate stripe and the second gate stripe, the continuous sidewall spacer is in direct contact with both the first gate stripe and the second gate stripe, wherein the continuous sidewall spacer has a first spacer length along the longitudinal direction and a first spacer width along a horizontal direction orthogonal to the longitudinal direction, the first spacer length is greater than the first spacer width, the continuous sidewall spacer comprises a dimple recess, wherein the predetermined distance is greater than an entire width of the second gate stripe along the horizontal direction;
a first un-merged sidewall spacer at a side of the first gate stripe opposite to a side of the continuous sidewall spacer;
a source region in the substrate and aligned to a sidewall of the first un-merged sidewall spacer;
a drain region in the substrate, the drain region is apart from the source region;
a lightly doped region in the substrate and aligned to a sidewall of the first gate stripe;
a P-type well of the substrate surrounding the source region; and
an N-type well of the substrate surrounding the drain region, a boundary of the P-type well and the N-type well is under the first gate stripe, the N-type well has a N-well length along the longitudinal direction, the continuous sidewall spacer is entirely within a vertical projection area of the N-type well from top view perspective, wherein the first un-merged sidewall spacer is entirely within a vertical projection area of the P-type well, the first un-merged sidewall spacer is free from overlapping with the N-type well from top view, and the second gate stripe is entirely within a vertical projection area of the N-type well;
wherein a bottom surface of the P-type well and a bottom surface of the N-type well are substantially at a same depth from the first gate stripe, the drain length is identical with the first spacer length, the drain length is less than the N-well length, wherein
the first spacer width is measured from one side of the continuous sidewall spacer to an opposite side of the continuous sidewall spacer across the longitudinal direction;
the drain length is measured from one edge of the drain region to an opposite edge of the drain region along the longitudinal direction; and
the N-well length is measured from one side of the N-type well to an opposite side of the N-type well across the longitudinal direction.

18. The transistor structure of claim 17, wherein:
the first un-merged sidewall spacer is entirely within a vertical projection area of the P-type well, and the first un-merged sidewall spacer is free from overlapping with the N-type well from top view;
the lightly doped region is free from being under a projection area of the first gate stripe and a projection area the second gate stripe;
a portion of the P-type well is between the lightly doped region and the N-type well;
the lightly doped region is spaced away from the N-type well; and
a bottom of the lightly doped region is at a level above the bottom surface of the P-type well.

19. A transistor structure, comprising:
a substrate;
a first gate extending along a longitudinal direction over the substrate, the first gate comprising a gate electrode, wherein the first gate has a first length along the longitudinal direction;
a second gate over the substrate and laterally in contact with the first gate, wherein the second gate has a second length along the longitudinal direction and a second width along a horizontal direction orthogonal to the longitudinal direction, wherein the second length is greater than the second width, and the second length substantially equals the first length;
a source region of a first conductivity type in the substrate, aligning to an edge in proximity to a side of the first gate, having a source length substantially equals the first length;
a P-type well surrounding the source region;
a drain region of the first conductivity type in the substrate, aligning to an edge in proximity to a side of the second gate, and having a drain length substantially equals the first length;

an N-type well surrounding the drain region, wherein the N-type well has an N-well length along the longitudinal direction, the N-well length is greater than the second length of the second gate, the second gate is entirely within a vertical projection area of the N-type well, a sidewall of the N-type well directly contacts a sidewall of the P-type well, and a bottom surface of the P-type well and a bottom surface of the N-type well are substantially at a same depth from the first gate;

a lightly doped region in the P-type well, aligning to a sidewall of the gate electrode of the first gate, wherein a boundary between the P-type well and the N-type well is under the first gate; and a continuous sidewall spacer between the first gate and the second gate, wherein the continuous sidewall spacer has a continuous sidewall spacer length along the longitudinal direction and a continuous sidewall spacer width along the horizontal direction, the continuous sidewall spacer length is measured from one side of the continuous sidewall spacer to an opposite side of the continuous sidewall spacer across the longitudinal direction, the continuous sidewall spacer width is measured from one edge of the continuous sidewall spacer to an opposite edge of the continuous sidewall spacer across the horizontal direction, the continuous sidewall spacer length is greater than the continuous sidewall spacer width, wherein:

the drain length is measured from one edge of the drain region to an opposite edge of the drain region along the longitudinal direction;

the source length is measured from one edge of the source region to an opposite edge of the source region along the longitudinal direction;

the second length is measured from one side of the second gate to an opposite side of the second gate across the longitudinal direction;

the second width is measured from one edge of the second gate to an opposite edge of the second gate across the horizontal direction; and the N-well length is measured from one side of the N-type well to an opposite side of the N-type well across the longitudinal direction.

20. The transistor structure of claim 19, wherein:

the lightly doped region is free from being under a projection area of the first gate and a projection area the second gate;

a portion of the P-type well is between the lightly doped region and the N-type well;

the lightly doped region is spaced away from the N-type well;

a bottom of the lightly doped region is at a level above a bottom of the source region; and the bottom of the lightly doped region is at a level above the bottom surface of the P-type well.

* * * * *